US011989140B2

(12) United States Patent
Spirkl et al.

(10) Patent No.: US 11,989,140 B2
(45) Date of Patent: May 21, 2024

(54) SIGNAL PATH BIASING IN A MEMORY SYSTEM

(71) Applicant: Micron Technology, Inc., Boise, ID (US)

(72) Inventors: Wolfgang Anton Spirkl, Germering (DE); Thomas Hein, Munich (DE); Martin Brox, Munich (DE); Peter Mayer, Neubiberg (DE); Michael Dieter Richter, Ottobrunn (DE)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 18/108,319

(22) Filed: Feb. 10, 2023

(65) Prior Publication Data

US 2023/0195655 A1  Jun. 22, 2023

Related U.S. Application Data

(62) Division of application No. 16/849,740, filed on Apr. 15, 2020, now Pat. No. 11,609,865.

(Continued)

(51) Int. Cl.
*G06F 13/16* (2006.01)
*G06F 13/12* (2006.01)
(Continued)

(52) U.S. Cl.
CPC .......... *G06F 13/12* (2013.01); *G06F 13/1668* (2013.01); *G11C 11/221* (2013.01);
(Continued)

(58) Field of Classification Search
CPC .................. G06F 13/1668; G11C 11/4093
See application file for complete search history.

(56) References Cited

U.S. PATENT DOCUMENTS

| 9,058,863 B2 | 6/2015 | Chen et al. |
| 2006/0140287 A1* | 6/2006 | Alon ............... H04L 5/1423 375/260 |

(Continued)

FOREIGN PATENT DOCUMENTS

WO  2012/012054 A1  1/2012

OTHER PUBLICATIONS

European Patent Office, "Supplementary European search report", issued in connection with European Patent Application No. 20791435 dated Dec. 13, 2022 (9 pages).

(Continued)

*Primary Examiner* — David E Martinez
(74) *Attorney, Agent, or Firm* — Holland & Hart LLP

(57) ABSTRACT

Methods, systems, and devices for signal path biasing in an electronic system (e.g., a memory system) are described. In one example, a memory device, a host device, or both may be configured to bias a signal path, between an idle state and an information transfer or between an information transfer and an idle state, to an intermediate or mid-bias voltage level, which may reduce signal interference associated with such transitions. In various examples, the described biasing to a voltage, such as a mid-bias voltage, may be associated with an access command or other command for information to be communicated between devices of the electronic system, such as a command for information to be communicated between a memory device and a host device.

20 Claims, 8 Drawing Sheets

Related U.S. Application Data

(60) Provisional application No. 62/835,264, filed on Apr. 17, 2019.

(51) Int. Cl.
*G11C 11/22* (2006.01)
*G11C 11/4093* (2006.01)
*G11C 11/4091* (2006.01)

(52) U.S. Cl.
CPC ...... *G11C 11/2259* (2013.01); *G11C 11/4093* (2013.01); *G11C 11/2273* (2013.01); *G11C 11/4091* (2013.01)

(56) References Cited

U.S. PATENT DOCUMENTS

| | | |
|---|---|---|
| 2006/0170453 A1 | 8/2006 | Zerbe et al. |
| 2009/0034344 A1 | 2/2009 | Nguyen et al. |
| 2009/0080266 A1* | 3/2009 | Zumkehr ............ G11C 7/1084 365/189.11 |
| 2019/0044762 A1 | 2/2019 | Lin |
| 2019/0103143 A1 | 4/2019 | Hasbun et al. |

OTHER PUBLICATIONS

International Search Report and Written Opinion received for PCT Patent Application No. PCT/US20/28465, dated Jul. 27, 2020, 11 pages.

\* cited by examiner

SIGNAL PATH BIASING IN A MEMORY SYSTEM

CROSS REFERENCE

The present Application for Patent is a divisional of U.S. patent application Ser. No. 16/849,740 by SPIRKL et al., entitled "SIGNAL PATH BIASING IN A MEMORY SYSTEM," filed Apr. 15, 2020, which claims the benefit of U.S. Provisional Patent Application No. 62/835,264 by SPIRKL et al., entitled "SIGNAL PATH BIASING IN A MEMORY SYSTEM," filed Apr. 17, 2019, each of which is assigned to the assignee hereof, and each of which is expressly incorporated by reference herein.

BACKGROUND

The following relates generally to a system that includes at least one memory device and more specifically to signal path biasing in a memory system.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some systems, signals that are transmitted between a memory device and a host device (e.g., a device hosting the memory device) may cause interference. Thus, signals transmitted in a memory system may affect other signals of the memory system, including other signals communicated between the memory device and the host device.

DETAILED DESCRIPTION

Figure 1:
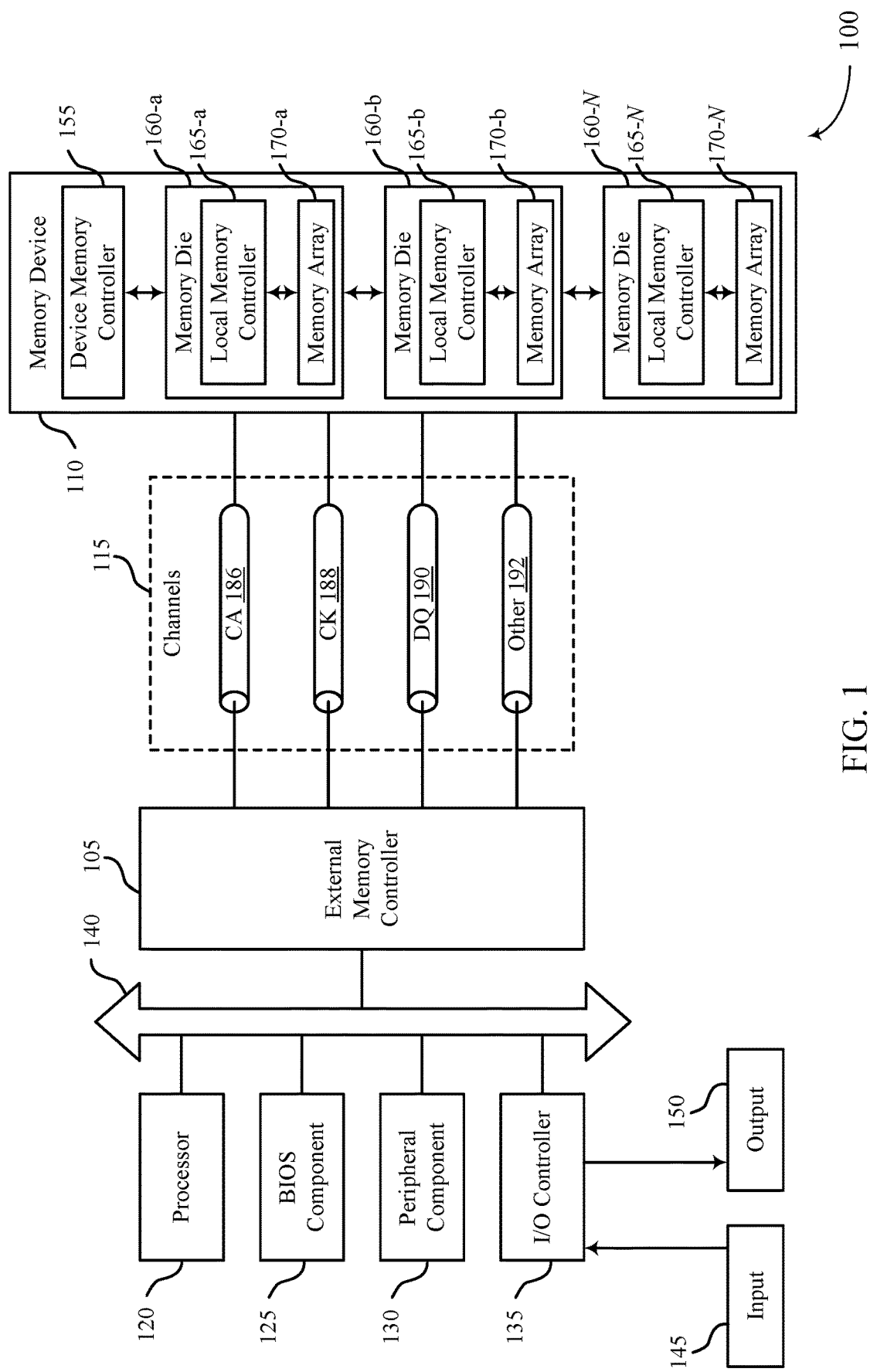
FIG. 1 illustrates an example of a system that supports signal path biasing in a memory system in accordance with examples as disclosed herein.

Some electronic systems may include a memory device and a host device (e.g., a device that uses the memory device to store information) and signals may be transmitted between the memory device and the host device. In some electronic systems, such signaling may cause interference (e.g., radio frequency (RF) interference, electromagnetic (EM) interference, electric field interference) with other signaling, such as other signaling between the memory device and the host device. In some cases, the signals transmitted by the memory device or the host device may affect components that are configured to receive such signals. Thus, signal transmission between a memory device and a host device may affect signal reception at the memory device or the host device, which may impact various operations performed by the electronic system that includes the memory system and the host device.

In some electronic systems, a transition between an idle state and a subsequent information transfer, or a transition between an information transfer and a subsequent idle state, may be associated with causing or driving relatively high interference. For example, in an idle state, one or both of a memory device or a host device may be configured to bias a signal path to an idle voltage, such as a termination voltage (e.g., a voltage of termination for the memory device, a voltage of termination for the host device, a voltage level associated with termination logic, a voltage level at a termination impedance), which may be associated with lower power consumption than when the signal path is biased to some voltage other than an idle or termination voltage. At a transition between an idle state and a subsequent information transfer (or vice-versa), a change in signal or signal path bias may be relatively large when transitioning from an idle voltage to a voltage level of the modulation scheme that is relatively farthest from the idle voltage (e.g., in a first modulation symbol of the data transfer). Such a relatively large change in signal or signal path bias may be associated with relatively high interference in an electronic system.

In accordance with examples as disclosed herein, an electronic system may be configured to bias a signal path in a manner to reduce interference with other signals during transitions to and from an idle state. For example, in some electronic systems, a memory device, a host device, or both may be configured to bias a signal path, between an idle state and a subsequent information transfer or between an information transfer and a subsequent idle state, to a voltage level that is between voltage levels of a modulation scheme used for communicating information (e.g., a mid-bias voltage). In some examples, the biasing may include biasing the signal path to a voltage that is greater than a lowest voltage level of the modulation scheme, less than a highest voltage level of the modulation scheme, or both. In some examples, the biasing may be a voltage level that is a middle value (e.g., an average voltage level, a mean voltage level) between voltage levels of the modulation scheme, and the middle value may or may not correspond to a voltage level of the modulation scheme that is used to communicate information (e.g., the biasing may not correspond to one of the voltage levels of the modulation scheme). In some examples, the biasing may correspond to a voltage level of a modulation scheme that is used to communicate information, but may or may not be an arithmetic average of other voltage levels of the modulation scheme.

Features of the disclosure are initially described in the context of a memory system and memory die as described with reference to FIGS. 1 and 2. Features of the disclosure are described in the context of diagrams and illustrative modulation schemes as described with reference to FIGS. 3 and 4. These and other features of the disclosure are further illustrated by and described with reference to apparatus diagrams and flowcharts that relate to channel modulation for a memory device as described with references to FIGS. 5 through 8.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, a graphics processing device, a vehicle, and others. The system 100 may be an example of a portable electronic device. The system 100 may be an example of a computer, a laptop computer, a tablet computer, a smartphone, a cellular phone, a wearable device, an internet-connected device, a vehicle, or others. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, a vehicle, or others. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses or other space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphics processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, gates, decoders, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or others.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may, in some cases, be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission media (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., non-return-to-zero (NRZ), pulse amplitude modulation (PAM) having some quantity of symbols or voltage levels, such as a PAM3 scheme associated with three symbols or voltage levels, a PAM4 scheme associated with four symbols or voltage levels, and others).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths, and may communicate signals that are modulated using a modulation scheme (e.g., PAM having some quantity of symbols or voltage levels).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, PAM having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., where a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, signaling transmitted between the memory device 110 and a host device (e.g., over channels 115) may cause interference, such as radio frequency (RF) interference, electromagnetic (EM) interference, electric field interference, or others. In some examples, interference caused by transmitted signaling may be related to the level or rate of change of current associated with the transmitted signaling, related to the level or rate of change of voltage associated with the transmitted signaling, or various combinations thereof. For example, a relatively faster rate of change of current or voltage of a transmitted signal may be associated with a relatively stronger or faster change in electric or electromagnetic field associated with the transmitted signal, whereas a relatively slower rate of change of current or voltage of a transmitted signal may be associated with a relatively weaker or slower change in electric or electromagnetic field associated with the transmitted signal. The transmitted signaling may be referred to as an aggressor or aggressor signal, and interference may be based at least in part on a level of the aggressor, the rate of change of the aggressor, and other phenomena.

In some systems, the interference from transmitted signaling may be incident on a signal-carrying path (e.g., a channel 115, a conductive path of the memory device 110 or a host device, a conductive path between a host device and the memory device 110) or a component that is part of a signal-carrying path for a signal that is to be received (e.g., a component of the memory device 110 or a host device, a component between a host device and the memory device 110). For example, an electric or electromagnetic field caused by signaling transmitted by the memory device 110, which may be an oscillating or otherwise changing electric or electromagnetic field, may be incident on a channel 115 that is associated with a signal that is to be received by the memory device 110 or an external memory controller 105. Similarly, an electric or electromagnetic field caused by signaling transmitted by an external memory controller 105, which may be an oscillating or otherwise changing electric or electromagnetic field, may be incident on a channel 115 that is associated with a signal that is to be received by the memory device 110 or an external memory controller 105.

In some examples, a channel 115 associated with receiving a signal may have a capacitive or inductive link or coupling with an aggressor, such as a capacitive or inductive link or coupling with another channel 115, a component of the memory device 110 (e.g., a transmitter), a component of a host device, or various combinations thereof. In one example, incident electric or electromagnetic field caused by transmitted signaling may change or disrupt a signal that is to be received (e.g., change or disrupt a current or voltage on the conductive path), or affect components that are configured to receive the signal, which may be referred to as "cross-talk" (e.g., AC crosstalk, capacitive cross-talk) In some examples, such cross-talk may affect (e.g., impair, prevent) the ability of the memory device 110 or a host device (e.g., the external memory controller 105) to concurrently transmit and receive signals.

The system 100 may be configured to transmit signaling or otherwise bias a signal path in a manner to reduce interference with other signals or components. For example, the memory device 110, a host device (e.g., the external memory controller 105), or both may be configured to bias a signal path (e.g., of a DQ channel), between an idle state and a subsequent information transfer or between an information transfer and a subsequent idle state, to a voltage level that is between voltage levels of a modulation scheme used for communicating information (e.g., a mid-bias voltage). The described biasing to a mid-bias voltage may be associated an access command (e.g., a read command, a write command) for information to be communicated between the memory device 110 and a host device. In one example, the memory device 110 may receive a read command (e.g., over a CA channel), and based at least in part on receiving the read command (e.g., in response to receiving the read command), the memory device 110 may bias a signal path (e.g., of a DQ channel) to a mid-bias voltage level before transmitting signaling that is modulated to include information associated with the read command. In another example, a host device (e.g., the external memory controller 105) may transmit a write command (e.g., over a CA channel), and based at least in part on write command (e.g., accompanying the transmission of the write command), the host device may bias a signal path (e.g., of a DQ channel) to a mid-bias voltage level before transmitting signaling that is modulated to include information associated with the write command. In some examples, such biasing that is performed before transmitting signaling modulated to include information associated with an access command may be referred to as a "preamble" (e.g., a mid-bias preamble), and such biasing that is performed after transmitting signaling modulated to include information associated with an access command may be referred to as a "postamble" (e.g., a mid-bias postamble).

Using the techniques described herein, interference of signaling between an idle state and a subsequent information transfer, or interference of signaling between an information transfer and a subsequent idle state, may be reduced relative to other techniques. For example, by inserting an intermediate bias between such transitions (e.g., as a preamble, as a postamble), a rate of change of signaling or signal path bias may be reduced, which may reduce electromagnetic fields, electric fields, or other forms of interference induced by the transmitted signaling. Thus, signal paths associated with received signaling may be exposed to reduced interference, which may improve a device's ability to simultaneously transmit and receive signaling. Accordingly, by reducing a signal swing or rate of change of signaling at such transitions, communication between a memory device 110 and a host device may be improved, which may improve performance of the system 100.

Figure 2:
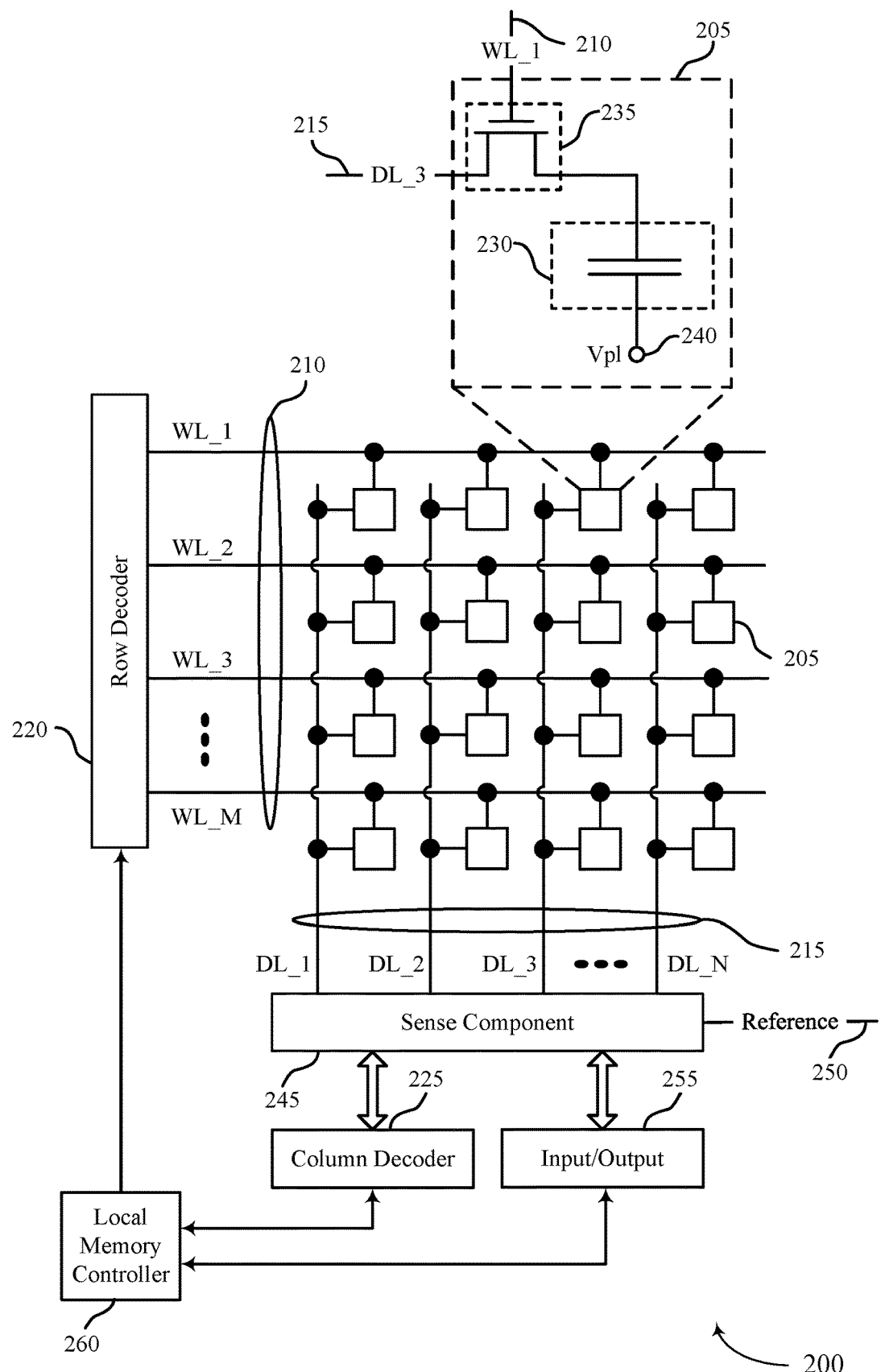
FIG. 2 illustrates an example of a memory die that supports signal path biasing in a memory system in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. The sense component 245 may be configured to compare the signal received from the memory cell 205 across the digit line 215 to a reference signal 250 (e.g., reference voltage). The detected logic state of the memory cell 205 may be provided as an output of the sense component 245 (e.g., to an input/output 255).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

The local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

The local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may communicate the logic state stored on the memory cell 205 to the external memory controller 105 (or the device memory controller 155) as part of the read operation.

The local memory controller 260 may be configured to transmit data associated with a write command or a read command to a host device. The local memory controller 260 (or device memory controller, as the case may be) may be configured to bias a signal path in a manner to reduce interference with other signals or components as part of transmitting data associated with a read command or a write command. For example, the local memory controller 260 may be configured to bias a signal path, between an idle state and a subsequent information transfer or between an information transfer and a subsequent idle state, to a voltage level that is between voltage levels of a modulation scheme used for communicating information (e.g., a mid-bias voltage).

Figure 3:
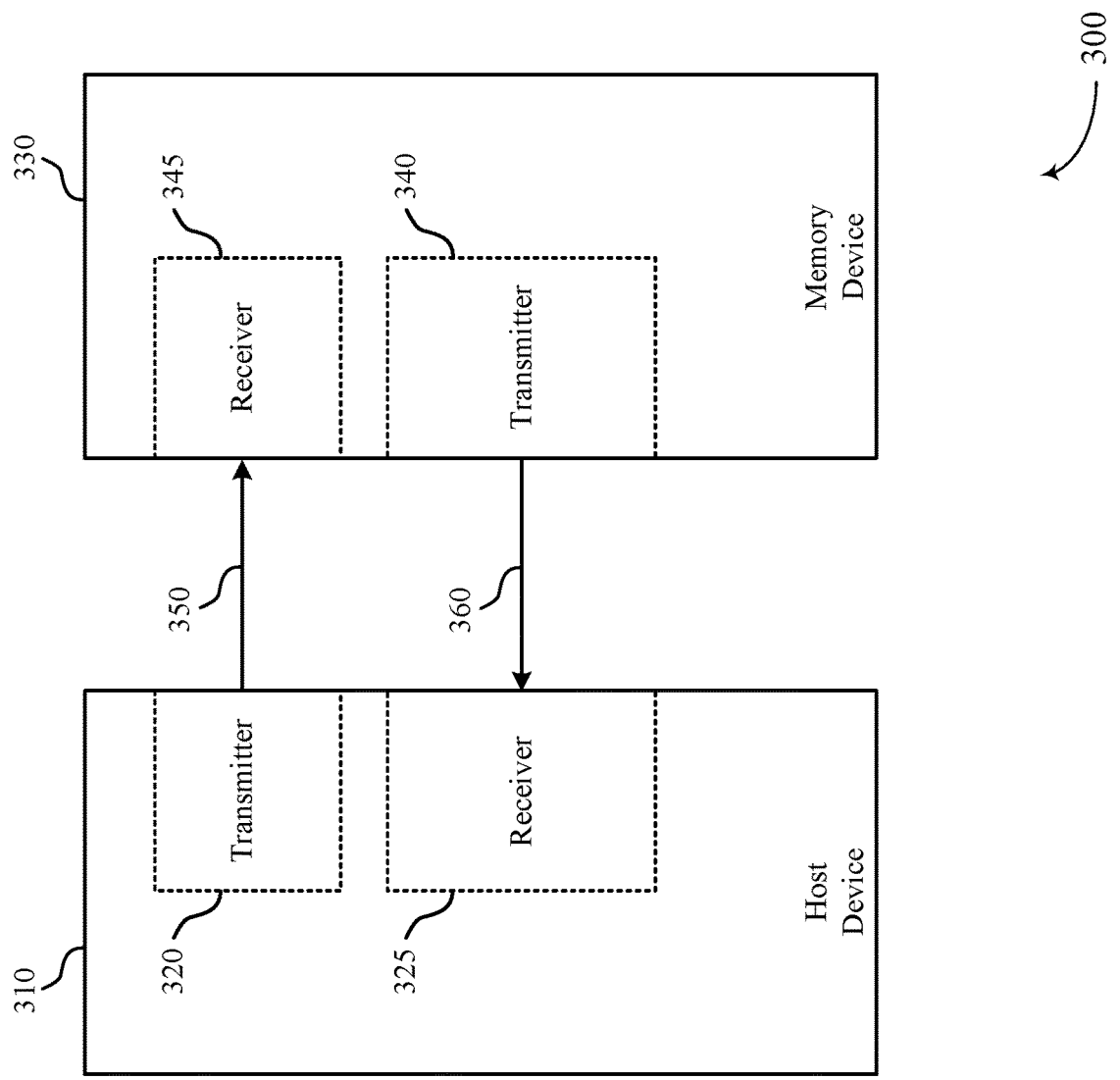
FIG. 3 illustrates an example of a system that supports signal path biasing in a memory system in accordance with examples as disclosed herein.

FIG. 3 illustrates an example of a system 300 that supports signal path biasing in a memory system in accordance with examples as disclosed herein. The system 300 includes a host device 310 and a memory device 330, and may be configured to support signaling over channels between the host device 310 and the memory device 330 (e.g., signal paths, transmission paths, channels 115 described with reference to FIG. 1).

The host device 310 may include a transmitter 320 and a receiver 325, which, in some examples, may be components of an external memory controller 105 described with reference to FIG. 1. In some examples, the transmitter 320 and the receiver 325 may be part of a transceiver component of the host device 310 (e.g., supporting bidirectional communication). The transmitter 320 may include or otherwise refer to a modulator or driver that is configured to process received information (e.g., received from another component of the host device 310) and, based on the processed information, modulate a signal to include the information for transmission by the host device 310 (e.g., by biasing a signal path associated with a channel according to voltage levels of a modulation scheme). The receiver 325 may include or otherwise refer to a demodulator that is configured to demodulate a signal that includes information for reception at the host device 310 (e.g., by detecting or decoding a bias on a signal path associated with a channel according to voltage levels of a modulation scheme).

Although illustrated as including a single transmitter 320, in some examples, a host device 310 may include a transmitter 320 for each channel of a set of channels, for each pin of a set of pins (e.g., of a set of pins associated with a channel), or various other configurations. Likewise, although illustrated as including a single receiver 325, in some examples, a host device 310 may include a receiver 325 for each channel of a set of channels, for each pin of a set of pins (e.g., of a set of pins associated with a channel), or various other configurations. In some examples, a transmitter 320 and a receiver 325 may be included in a channel-specific transceiver, such as a transceiver configured to communicate signaling over a bidirectional channel (e.g., a DQ channel), or some other channel, having one or more transmission paths (e.g., one or more pins, one or more conductors).

The memory device 330 may include a transmitter 340 and a receiver 345, which, in some examples, may be components of a device memory controller 155 described with reference to FIG. 1. In some examples, the transmitter 340 and the receiver 345 may be part of a transceiver of the memory device 330 (e.g., supporting bidirectional communication). The transmitter 340 may include or otherwise refer to a modulator or driver that is configured to process received information (e.g., received from another component of the memory device 330) and, based on the processed information, modulate a signal to include the information for transmission by the memory device 330 (e.g., by biasing a signal path associated with a channel according to voltage levels of a modulation scheme). The receiver 345 may include or otherwise refer to a demodulator that is configured to demodulate a signal that includes information for reception at the memory device 330 (e.g., by detecting or decoding a bias on a signal path associated with a channel according to voltage levels of a modulation scheme).

Although illustrated as including a single transmitter 340, in some examples, a memory device 330 may include a transmitter 340 for each channel of a set of channels, for each pin of a set of pins (e.g., of a set of pins associated with a channel), or various other configurations. Likewise, although illustrated as including a single receiver 345, in some examples, a memory device 330 may include a receiver 345 for each channel of a set of channels, for each pin of a set of pins (e.g., of a set of pins associated with a channel), or various other configurations. In some examples, a transmitter 340 and a receiver 345 may be included in a channel-specific transceiver, such as a transceiver configured to communicate over a bidirectional channel such as a data channel (e.g., a DQ channel) having one or more transmission paths (e.g., one or more pins, one or more conductors).

The system 300 may be configured to communicate first signaling 350 (e.g., signaling from the host device 310 to the memory device 330) and second signaling 360 (e.g., signaling from the memory device 330 to the host device 310). In some examples, the first signaling 350 may include or refer to access command signaling (e.g., write commands, read commands, rewrite commands, refresh commands) over a channel that is configured for access command signaling (e.g., a CA channel), or include or refer to data or other information signaling (e.g., write data, a write signal) over a channel that is configured for data (e.g., a DQ channel), or other information signaling. In some examples, the second signaling 360 may include or refer to data or other information signaling (e.g., read data, a read signal) over a channel that is configured for data (e.g., a DQ channel), error detection signaling (e.g., error detection information, a checksum, an error detection signal) over a channel that is configured for error detection and correction information (e.g., an EDC channel), or other information signaling. In various examples, the first signaling 350 and the second signaling 360 may be associated with one or more signal paths. For example, the first signaling 350 or the second signaling 360 may be carried on a 1-line channel, a 2-line channel, a 4-line channel, an 8-line channel, or some other quantity of signal paths.

A configuration of the system 300 may result in one signal of the system 300 causing interference (e.g., being an aggressor signal or otherwise associated with an aggressor signal path) and another signal of the system 300 being affected by such interference (e.g., being a victim signal or otherwise associated with a victim signal path). For example, second signaling 360 (e.g., an aggressor signal) may cause interference, such as radio frequency (RF) interference, electromagnetic (EM) interference, electric field interference, or others on the first signaling 350 (e.g., a victim signal). In some examples, interference caused by the second signaling 360 may be related to the level or rate of change of current associated with the transmitted signaling, related to the level or rate of change of voltage associated with the transmitted signaling, other phenomena, or various combinations thereof. For example, a relatively faster rate of change of current or voltage of the second signaling 360 may be associated with a relatively stronger or faster change in electric or electromagnetic field, whereas a relatively slower rate of change of current or voltage of the second signaling 360 may be associated with a relatively weaker or slower change in electric or electromagnetic field associated with the transmitted signal.

Interference from the second signaling 360 may be experienced on a signal-carrying path (e.g., a channel 115, a conductive path of the memory device 110 or a host device, a conductive path between a host device and the memory device 110), such as a signal path associated with the first signaling 350, or a component that is part of a signal-carrying path for the first signaling 350 (e.g., the receiver 345, the transmitter 320), any of which may be referred to as a victim signal path. For example, an electric or electromagnetic field caused by the second signaling 360, which may be an oscillating or otherwise changing electric or electromagnetic field, may be incident on a channel configured to carry the first signaling 350. In some examples, the incidence or susceptibility of such interference may be associated with a capacitive coupling or an inductive coupling, which may be related to geometry or layout of various components of the system 300. An incident electric or electromagnetic field caused by the second signaling 360 may change or disrupt the first signaling 350 (e.g., change or disrupt a current or voltage on the conductive path), or affect components that are configured to receive the first signaling 350 (e.g., the receiver 345). Likewise, an incident electric or electromagnetic field caused by the first signaling 350 may change or disrupt the second signaling 360 (e.g., change or disrupt a current or voltage on the conductive path), or affect components that are configured to receive the second signaling 360 (e.g., the receiver 325). In some examples, cross-talk such as the examples described, or other examples of cross-talk phenomena, aggressors, or victims, may affect (e.g., impair, prevent) the ability of one or both of the host device 310 or the memory device 330 to concurrently transmit and receive signals.

In some examples of the system 300, a signal transition between an idle state and an information transfer may be associated with causing or driving relatively high interference on a victim signal or signal path. In various examples, an idle state may refer to an idle state of the system 300, an idle state of the host device 310, an idle state of the memory device 330, or combinations thereof. For example, in an idle state, one or both of the memory device 330 or the host device 310 may be configured to bias a signal path to an idle voltage. In some examples, an idle voltage may be equal to or otherwise associated with a voltage of a termination (e.g., a voltage level of a termination for the memory device 330, a voltage level of termination for the host device 310, a voltage level of a termination for the signal path), which may be associated with lower power consumption than when the signal path is biased to some voltage other than a voltage of a termination. For information transfer between the memory device 330 and the host device 310, the system may be configured to communicate signaling that is modulated using a modulation scheme that includes a set of voltage levels (e.g., by biasing a signal path, such as one or more signal paths of a DQ channel, to one of the voltage levels of the modulation scheme to represent, transmit, or otherwise communicate a modulation symbol).

At a transition between an idle state and a subsequent information transfer, for example, a change in signal or signal path bias may be relatively large when transitioning from an idle voltage to a voltage level of the modulation scheme that is relatively farthest from the idle voltage (e.g., in a first modulation symbol of the data transfer), and the relatively large change in signal or signal path bias at the beginning of the information transfer may be associated with driving or causing relatively high interference (e.g., a relatively strong aggressor). At a transition between an information transfer and a subsequent idle state, for example, a change in signal or signal path bias may be relatively large when transitioning from a voltage level of the modulation scheme that is relatively farthest from an idle voltage (e.g., in a last modulation symbol of the information transfer) to the idle voltage, and the relatively large change in signal or signal path bias after the information transfer may accordingly be associated with relatively high interference (e.g., a relatively strong aggressor).

The system 300 may be configured to communicate signaling (e.g., first signaling 350, second signaling 360) or otherwise bias a signal path in a manner to reduce interference with other signals or signal paths (e.g., reducing interference to victim signals or signal paths). The memory device 330, the host device 310, or both may be configured to bias a signal path, between an idle state and a subsequent information transfer or between an information transfer and a subsequent idle state, to an intermediate or mid-bias voltage level. For example, the memory device 330 or the host device or both may bias the signal path to a voltage level that is between voltage levels of a modulation scheme used for communicating information (e.g., a mid-bias voltage), which may reduce a rate of change of signaling associated with such transitions.

In various examples, the described biasing to a mid-bias or otherwise intermediate voltage may be associated with or otherwise accompany an access command (e.g., a read command, a write command) for information to be communicated between the memory device 330 and the host device 310. In one example, the memory device 330 may receive a read command from the host device 310 (e.g., over a CA channel, via first signaling 350), and based at least in part on receiving the read command (e.g., in response to receiving the read command), the memory device 330 may bias a signal path to a mid-bias voltage level before transmitting signaling that is modulated to include information associated with the read command (e.g., over a DQ channel, via second signaling 360). In another example, the host device 310 may transmit a write command to the memory device 330 (e.g., over a CA channel, via first signaling 350), and based at least in part on write command (e.g., accompanying the transmission of the write command), the host device 310 may bias a signal path to a mid-bias voltage level before transmitting signaling that is modulated to include information associated with the write command (e.g., over a DQ channel, via first signaling 350).

In some examples, such biasing that is performed before transmitting signaling modulated to include information associated with an access command may be referred to as a "preamble" (e.g., a mid-bias preamble, an intermediate preamble symbol or sequence), and such biasing that is performed after transmitting signaling modulated to include information associated with an access command may be referred to as a "postamble" (e.g., a mid-bias postamble, an intermediate postamble symbol or sequence). In cases where preambles and postambles are included in signaling over a bidirectional channel, a transmitter of a preamble or postamble may have voltage control or biasing authority of the bidirectional channel for a duration (e.g., for biasing one or more signal paths associated with the channel in accordance with the particular preamble or postamble), and a receiver of the preamble or postamble may recognize the presence of the preamble or postamble on the bidirectional channel for the respective duration, which may include the receiver ignoring signaling associated with the preamble or postamble, or otherwise processing a preamble or postamble differently than other data, payload, or information (e.g., avoiding decoding of the preamble or postamble, decoding the preamble or postamble but recognizing that the preamble or postamble is not part of information associated with an access command).

Figure 4:
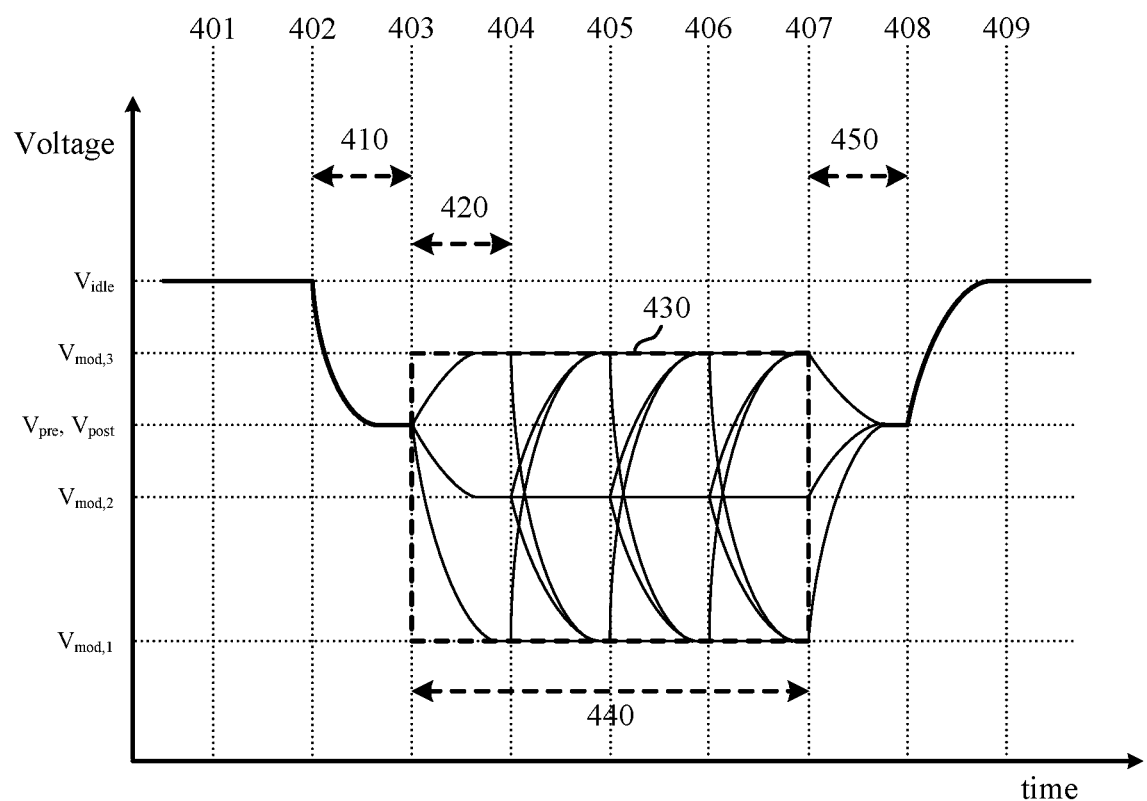
FIG. 4 illustrates an example of a timing diagram that supports signal path biasing in a memory system in accordance with examples as disclosed herein.

FIG. 4 illustrates an example of a timing diagram 400 that supports signal path biasing in a memory system in accordance with examples as disclosed herein. The timing diagram 400 may illustrate a voltage over time of a signal path in a system 300, such as a signal path between a host device 310 and a memory device 330, as described with reference to FIG. 3. In some examples, the timing diagram 400 may illustrate voltages of one or more signal paths of a channel configured to convey information between a host device 310 and a memory device 330, such as a DQ channel associated with one or more signal paths, which, in some examples, may be a bidirectional channel.

The timing diagram 400 illustrates a burst 430 of information communicated over a signal path of a channel along with idle periods, a preamble (e.g., preamble duration 410), and a postamble (e.g., postamble duration 450). The timing diagram 400 is illustrated with a set of voltages that may be configured in a system 300. Although the configured voltage levels of the timing diagram 400 are illustrated with particular spacing along the vertical axis, the voltage levels of the timing diagram 400 are for illustration purposes, and are not to indicate any limitation of particular relative magnitude of spacing between one voltage level and another. Further, the biasing described with reference to timing diagram 400 may include a selective coupling with a voltage source that is initiated in the described operations, and the described signal path may or may not reach the same voltage as the coupled voltage source, instantaneously or otherwise. For example, as illustrated, the signal path may approach a voltage level of a coupled voltage source according to a time constant behavior, though the signal path may be coupled with the voltage source or otherwise controlled to a particular voltage level over an entire duration between described operations.

The timing diagram 400 includes an idle voltage level, $V_{idle}$, which may refer to a voltage of a signal path during an idle or standby state (e.g., when a memory device 330 is not being actively read or written to). In various examples, a signal path may be biased to $V_{idle}$ by a host device 310, a memory device 330, or both, based on a configuration of the system 300 or an operating state of the system 300 (e.g., based on a configuration of one device or another that has voltage control or biasing authority of the signal path during an idle state). In some examples, the idle voltage may be configured to be equal to a termination voltage of a system 300 (e.g., a termination voltage at a memory device 330, a termination voltage at a host device 310), which may reduce power consumption during an idle state in comparison to when a signal path is biased to a voltage different than a termination voltage. In some examples, the idle voltage level may be configured to be equal to an input/output supply voltage. Although the timing diagram 400 is illustrated as having a relatively high idle voltage level, in some examples, an idle voltage level may be relatively low, such as a ground voltage, a chassis ground, or a virtual ground, which may be used in a ground-terminated system.

The timing diagram 400 also includes a set of voltages $\{V_{mod,1}, V_{mod,2}, V_{mod,3}\}$ associated with a modulation scheme (e.g., PAM3 or PAM4), which may be used to convey information along the signal path (e.g., voltage levels that correspond to modulation symbols of the modulation scheme). In the example of timing diagram 400, three voltage levels associated with a modulation scheme are illustrated, which may correspond to the voltage levels of a PAM3 modulation scheme. However, the described techniques may be used for signal paths that support modulation schemes including any quantity of voltage levels (e.g., four voltage levels of a PAM4 modulation scheme, more than four voltage levels, two voltage levels of a binary modulation scheme).

Although each of the set of voltages associated with a modulation scheme in the example of timing diagram 400 are shown as being different than the idle voltage (e.g., $V_{idle}$ is not included in the set of $\{V_{mod,1}, V_{mod,2}, V_{mod,3}\}$), in other examples, $V_{idle}$ may be included in the set of voltage levels used in a modulation scheme. For example, $V_{idle}$ may be equal to a highest voltage level of a modulation scheme (e.g., $V_{idle}$ may be equal to $V_{mod,3}$), or $V_{idle}$ may be equal to a lowest voltage level of a modulation scheme (e.g., $V_{idle}$ may be equal to $V_{mod,1}$, which may be equal to or otherwise correspond to a ground or chassis ground voltage level), either of which may be equal to a termination voltage level.

The timing diagram 400 also illustrates one or more voltage levels that may be used as biasing voltages during a preamble duration 410. Such voltage levels may be referred as to a preamble voltage, $V_{pre}$, which may refer to a voltage level of a preamble, a preamble symbol, a preamble sequence, or other intermediate biasing of the signal path after an idle state and prior to a subsequent information transfer. In some examples, the preamble voltage may be higher than the lowest voltage level associated with the modulation scheme (e.g., $V_{pre}$ may be higher than $V_{mod,1}$), lower than the highest voltage level associated with the modulation scheme (e.g., $V_{pre}$ may be lower than $V_{mod,3}$), or both (e.g., $V_{pre}$ may be between $V_{mod,1}$ and $V_{mod,3}$). In some examples (not shown), the preamble voltage may be a midpoint voltage level between a lowest voltage level associated with the modulation scheme and a highest voltage level associated with the modulation scheme (e.g., $V_{pre}$ may be equal to an average of $V_{mod,1}$ and $V_{mod,3}$). In another example (not shown), on a signal path that uses a modulation scheme that includes a set of four voltage levels $\{V_{mod,1a}, V_{mod,2a}, V_{mod,3a}, V_{mod,4a}\}$ in ascending order (e.g., according to a PAM4 modulation scheme), $V_{pre}$ may be equal to an average of $V_{mod,1a}$ and $V_{mod,4a}$), which may not be included in the set of voltage levels associated with the modulation scheme.

Although the preamble voltage is illustrated as being a different voltage level than those used in the modulation scheme, in some examples, a preamble voltage may be equal to one of the voltage levels included in a modulation scheme. For example, on a signal path using a modulation scheme that includes three voltage levels to convey information (as illustrated, which may correspond to a PAM3 modulation scheme), a preamble voltage level may be equal to a middle voltage level of the modulation scheme (e.g., $V_{pre}$ may be equal to $V_{mod,2}$). In another example (not shown), on a signal path using a modulation scheme that includes a set of four voltage levels $\{V_{mod,1a}, V_{mod,2a}, V_{mod,3a}, V_{mod,4a}\}$ in ascending order (e.g., according to a PAM4 modulation scheme), a preamble voltage level may be equal to either one of the middle voltage levels of the modulation scheme (e.g., $V_{pre}$ may be equal to $V_{mod,2a}$ or $V_{mod,3a}$), which may be based on a static configuration, a dynamic configuration, or an operating condition of a system 300, or modulation of a particular information transfer (e.g., based at least in part on a voltage level of first symbol of an information transfer).

Although the preamble voltage is illustrated as being within a range of voltage levels of a modulation scheme, in other examples (not shown) a preamble voltage may be outside the range of voltage levels of a modulation scheme and still support reduced interference as described herein, such as when an idle voltage before an information transfer is also outside the range of voltage levels of the modulation scheme. In other words, to support the described reduction of interference between an idle state and a subsequent information transfer, a preamble voltage may be any voltage level that is between a voltage level of the idle state and a voltage level of a modulation scheme for the subsequent information transfer that is farthest from the voltage level of the idle state, where such a preamble voltage would accordingly result in a reduced voltage swing (e.g., in a single step or operation) when transitioning from the idle state to the subsequent information transfer.

The timing diagram 400 also illustrates one or more voltage levels that may be used as biasing voltages during a postamble duration 450. Such voltage levels may be referred to as a postamble voltage, $V_{post}$, which may refer to a voltage level of a postamble, a postamble symbol, a postamble sequence, or other intermediate biasing of the signal path after an information transfer and prior to a subsequent idle state. Although the timing diagram 400 is illustrated as having a preamble voltage and a postamble voltage that are equal, in various examples, the postamble voltage may or may not be equal to a preamble voltage (e.g., $V_{post}$ may be equal to $V_{pre}$ or $V_{post}$ may be different than $V_{pre}$). Although the example of the timing diagram 400 includes both a preamble and a postamble as described herein, in some examples, a system 300 or operation thereof may support or include one of a preamble before an information transfer or a postamble after an information transfer, in which case one of the preamble voltage or the postamble voltage, and the associated operations, may be omitted.

In some examples, the postamble voltage may be higher than the lowest voltage level associated with the modulation scheme (e.g., $V_{post}$ may be higher than $V_{mod,1}$), lower than the highest voltage level associated with the modulation scheme (e.g., $V_{post}$ may be lower than $V_{mod,3}$), or both (e.g., $V_{post}$ may be between $V_{mod,1}$ and $V_{mod,3}$). In some examples (not shown), the postamble voltage may be a midpoint voltage level between a lowest voltage level associated with the modulation scheme and a highest voltage level associated with the modulation scheme (e.g., $V_{post}$ may be equal to an average of $V_{mod,1}$ and $V_{mod,3}$). In another example (not shown), on a signal path that uses a modulation scheme that includes a set of four voltage levels $\{V_{mod,1a}, V_{mod,2a}, V_{mod,3a}, V_{mod,4a}\}$ in ascending order (e.g., according to a PAM4 modulation scheme), $V_{post}$ may be equal to an average of $V_{mod,1a}$ and $V_{mod,4a}$), which may not be included in the set of voltage levels associated with the modulation scheme.

Although the postamble voltage is illustrated as being a different voltage level than those used in the modulation scheme, in some examples, a postamble voltage may be equal to one of the voltage levels included in a modulation scheme. For example, on a signal path using a modulation scheme that includes three voltage levels to convey information (as illustrated, which may correspond to a PAM3 modulation scheme), a postamble voltage level may be equal to a middle voltage level of the modulation scheme (e.g., $V_{post}$ may be equal to $V_{mod,2}$). In another example (not shown), on a signal path using a modulation scheme that includes a set of four voltage levels $\{V_{mod,1a}, V_{mod,2a}, V_{mod,3a}, V_{mod,4a}\}$ in ascending order (e.g., according to a PAM4 modulation scheme), a postamble voltage level may be equal to either one of the middle voltage levels of the modulation scheme (e.g., $V_{post}$ may be equal to $V_{mod,2a}$ or $V_{mod,3a}$), which may be based on a static configuration, a dynamic configuration, or an operating condition of a system 300, or modulation of a particular information transfer (e.g., based at least in part on a voltage level of last symbol of an information transfer).

Although the postamble voltage is illustrated as being within a range of voltage levels of a modulation scheme, in other examples (not shown) a postamble voltage may be outside the range of voltage levels of a modulation scheme and still support reduced interference as described herein, such as when an idle voltage after an information transfer is also outside the range of voltage levels of the modulation scheme. In other words, to support the described reduction of interference between an information transfer and a subsequent idle state, a postamble voltage may be any voltage level that is between a voltage level of a modulation scheme for the information transfer that is farthest from a voltage level of a subsequent idle state and a voltage level of the subsequent idle state, where such a postamble voltage would accordingly result in a reduced voltage swing (e.g., in a single step or operation) when transitioning from the information transfer to the subsequent idle state.

The timing diagram 400 illustrates various transitions from one of the configured voltage levels to another, which are described in relation to a particular order of operations of a system 300. Although described with reference to particular times, such times or associated operations may be relevant to one or both of a host device 310 or a memory device 330, and may correspond to the one of the devices that has voltage control or biasing authority of a signal path at that time. In various examples, the one of the devices that has voltage control or biasing authority of the signal path may be the same device for each of the operations of the timing diagram 400, or different devices may have voltage control or biasing authority at different operations of the timing diagram 400, including the examples described at each of the operations of the timing diagram 400.

At 401, the system 300 may be in an idle state. Accordingly, the signal path may be biased to the idle voltage $V_{idle}$, which may be controlled by either the host device 310 or the memory device 330, depending on whether the host device 310 or the memory device 330 has voltage control or biasing authority of the signal path at 401 (e.g., based on a configuration for biasing authority during an idle state).

At 402, the system 300 may initiate biasing the signal path to an intermediate or mid-bias voltage level (e.g., $V_{pre}$), which may be associated with a preamble (e.g., a preamble voltage level, a preamble symbol). For example, operations of 402 may illustrate prepending a preamble (e.g., to the burst 430), or changing a voltage of the signal path with a preamble. In some examples, the operations of 402 may be triggered based at least in part on an access operation (e.g., a read operation of the memory device 330, a write operation of the memory device, a rewrite operation of the memory device, a refresh operation of the memory device), and accordingly may be based on or otherwise accompany an access command. In some examples, the biasing initiated at 402 may be associated with a preamble duration 410 between initiating the biasing and initiating an information transfer (e.g., initiating a burst 430 at 403).

In examples where the timing diagram 400 illustrates aspects of a read operation, the memory device 330 may receive a read command (e.g., over a control channel, over a CA channel), and the memory device 330 may initiate or otherwise control biasing the signal path to $V_{pre}$ at 402 based at least in part on receiving the read command (e.g., appending a preamble voltage level, symbol, or sequence to the read information transfer). In such examples, the memory device 330 may have biasing authority of the signal path, which may be based on or otherwise be accompanied by command signaling from the host device 310 (e.g., a determination of biasing authority by the memory device 330 based on the read command from a host device 310). In various examples, the host device 310 may ignore the biasing initiated at 402 (e.g., over the preamble duration 410), or the host device 310 may avoid decoding the biasing initiated at 402, or the host device 310 may decode the biasing initiated at 402 but may understand that the biasing is not part of information associated with the read operation (e.g., according to an understanding of the preamble duration 410). In some examples, the host device 310 may switch to or maintain a higher receiver impedance (e.g., a higher impedance termination of the receiver 325) at 402, which may support greater power savings or efficiency than when a lower receiver impedance is configured during a preamble duration. In some examples where the timing diagram 400 illustrates aspects of a read operation, the host device 310 may transmit a read command and may also initiate or otherwise control biasing the signal path to $V_{pre}$ at 402 (e.g., according to a predefined preamble duration 410), such as when the host device 310 maintains biasing authority from an idle state through the operations of 402, and prior to the burst 430.

In examples where the timing diagram 400 illustrates aspects of a write operation, the host device 310 may transmit a write command (e.g., over a control channel, over a CA channel), to the memory device 330, and the host device 310 may initiate or otherwise control biasing the signal path to $V_{pre}$ at 402 based at least in part on the write command (e.g., appending a preamble voltage level, symbol, or sequence to the write information transfer). In such examples, the host device 310 may have biasing authority of the signal path, which may be based on or otherwise be accompanied by command signaling from the host device 310 (e.g., a determination of biasing authority by the host device 310 based on determining or transmitting the write command by the host device 310). In various examples, the memory device 330 may ignore the biasing initiated at 402 (e.g., over the preamble duration 410), or the memory device 330 may avoid decoding the biasing initiated at 402, or the memory device 330 may decode the biasing initiated at 402 but may understand that the biasing is not part of information associated with the write operation (e.g., according to an understanding of the preamble duration 410). In some examples, the memory device 330 may switch to or maintain a higher receiver impedance (e.g., a higher impedance termination of the receiver 345) at 402, which may support greater power savings or efficiency than when a lower receiver impedance is configured during a preamble duration.

At 403, the system 300 may initiate an information transfer. For example, the system may communicate signaling over the signal path, where the signaling corresponds to a signal that is modulated to include the information using the modulation scheme having the set of voltage levels $\{V_{mod,1}, V_{mod,2}, V_{mod,3}\}$. Thus, at 403 the signal path may begin a transition from $V_{pre}$ to one of $V_{mod,1}$, $V_{mod,2}$, or $V_{mod,3}$ depending on the information that is to be conveyed in the first modulation symbol of the information transfer (e.g., depending on the value of the first modulation symbol initiated at 403).

As a result of biasing the signal path to $V_{pre}$, (e.g., as a result of the preamble) as initiated at 402, the voltage swing associated with the operations of 403 may be less than the possible voltage swing that would be experienced by the system 300 when the operations of 402 are omitted. For example, when a first modulation symbol of an information transfer corresponds to a voltage level that is farthest from an idle voltage (e.g., $V_{mod,1}$), the voltage swing associated with the operations of 403 may be as high as $V_{idle}-V_{mod,1}$ when the operations of 402 are omitted, but may be reduced to $V_{pre}-V_{mod,1}$ when the operations of 402 are included. Accordingly, by including the operations of 402, interference associated with the operations of 403 may be reduced.

In some examples, the device that performs the biasing at 403 may be based on the type of access operation associated with the information to be communicated. For example, where the timing diagram 400 illustrates aspects of a read operation, the memory device 330 may initiate or otherwise control biasing the signal path at 403 to one of the voltage levels of the modulation scheme (e.g., when the memory device 330 has voltage control or biasing authority of the signal path to convey information associated with a read command), based on the information associated with the read operation to be carried in a first modulation symbol. Accordingly, the host device 310 may detect the biasing to demodulate or otherwise decode the signaling at some time after 403 (e.g., before a subsequent biasing is initiated at 404) to receive the information. In another example, where the timing diagram 400 illustrates aspects of a write operation, the host device 310 may initiate or otherwise control biasing the signal path at 403 to one of the voltage levels of the modulation scheme (e.g., when the host device 310 has voltage control or biasing authority of the signal path to convey information associated with a write command), based on the information associated with the write operation to be carried in a first modulation symbol. Accordingly, the memory device 330 may detect the biasing to demodulate or otherwise decode the signaling at some time after 403 (e.g., before a subsequent biasing is initiated at 404) to receive the information.

In some examples, the biasing at 403 may be associated with a symbol duration 420 between initiating the first modulation symbol at 403 and initiating a subsequent modulation symbol (e.g., initiating a biasing of the signal path to one of the voltage levels in the set of voltages $\{V_{mod,1}, V_{mod,2}, V_{mod,3}\}$ associated with the modulation scheme at 404). In some examples, the symbol duration 420 may be related to transitions of a clock signal (e.g., as conveyed over a WCK channel), and a symbol duration 420 may correspond to a duration between rising edges of the clock signal or a duration between falling edges of the clock signal (e.g., according to a single data rate timing), or a symbol duration 420 may correspond to a duration between a rising edge and a falling edge of the clock signal or a falling edge and a rising edge of the clock signal (e.g., according to a double data rate timing). In some examples, information of an access command may be associated with a set of modulation symbols, and accordingly may be associated with a set of symbol durations 420. For example, the timing diagram 400 may illustrate an example of an information transfer associated with four modulation symbols (e.g., a first initiated at 403, a second initiated at 404, a third initiated at 405, and a fourth initiated at 406). In other examples, an information transfer in accordance with the described techniques may be associated with a single modulation symbol or symbol duration 420, or any other quantity of modulation symbols or symbol durations 420.

In some examples, information communicated for an access command may be arranged according to one or more bursts that include a plurality of modulation symbols, such as a burst 430 that includes four modulation symbols and accordingly corresponds to a burst duration 440 including four symbol durations 420. Although the burst 430 is illustrated as including four modulation symbols (e.g., four symbol durations 420), a burst 430 may include any quantity of modulation symbols or symbol durations 420 (e.g., a two-symbol burst, an eight-symbol burst, a sixteen symbol burst, a single-symbol burst). Further, although the timing diagram 400 is illustrated with a single burst 430 after the preamble of 402 (e.g., before a postamble), various access operations in accordance with the described biasing to an intermediate voltage level before an information transfer may be associated with any quantity of bursts 430 (e.g., one or more burst durations 440).

At 407, and after or at the end of the burst 430, the system 300 may initiate biasing the signal path to an intermediate or mid-bias voltage level (e.g., $V_{post}$), which may be associated with a postamble. For example, operations of 407 may illustrate appending a postamble (e.g., to the burst 430), or changing a voltage of the signal path with a postamble. In various examples, the operations of 407 may be initiated by the host device 310 or the memory device 330. In some examples, the biasing initiated at 407 may be associated with a postamble duration 450 between initiating the biasing and initiating a transition to an idle state (e.g., at 408).

In examples where the timing diagram 400 illustrates aspects of a read operation, the memory device 330 may initiate or otherwise control biasing the signal path to $V_{post}$ at 407 based at least in part on completing the burst 430 (e.g., appending a postamble voltage level, symbol, or sequence to the end of the burst 430). In such examples, the memory device 330 may maintain biasing authority of the signal path, which may be based on or otherwise be accompanied by command signaling from the host device 310 (e.g., a determination of biasing authority by the memory device 330 based on the read command from a host device 310). In various examples, the host device 310 may ignore the biasing initiated at 407 (e.g., over the postamble duration 450, based on an understanding of the host device 310 that the burst 430 has completed such as an understanding of an amount of information associated with the read command or an understanding of the burst duration 440), or the host device 310 may avoid decoding the biasing initiated at 407, or the host device 310 may decode the biasing initiated at 407 but may understand that the biasing is not part of information associated with the read operation (e.g., according to an understanding of the postamble duration 450 and an understanding that the burst 430 has completed). In some examples, the host device 310 may switch to or maintain a higher receiver impedance (e.g., a higher impedance termination of the receiver 325) at 407, which may support greater power savings or efficiency than when a lower receiver impedance is configured during a postamble duration. In some examples where the timing diagram 400 illustrates aspects of a read operation, the host device 310 may know when the burst 430 will end, and accordingly the host device 310 may initiate or otherwise control biasing the signal path to $V_{post}$ at 407 in examples where the timing diagram 400 illustrates a read command, such as when the host device 310 takes over biasing authority after the burst 430 and prior to or through an idle state.

In examples where the timing diagram 400 illustrates aspects of a write operation, the host device 310 may initiate or otherwise control biasing the signal path to $V_{post}$ at 407 based at least in part on completing the burst 430 (e.g., appending a postamble voltage level, symbol, or sequence to the end of the burst 430). In such examples, the host device 310 may maintain biasing authority of the signal path, which may be based on or otherwise be accompanied by command signaling from the host device 310 (e.g., a determination of biasing authority by the host device 310 based on determining or transmitting the write command by the host device 310). In various examples, the memory device 330 may ignore the biasing initiated at 407 (e.g., over the postamble duration 450, based on an understanding of the memory device 330 that the burst 430 has completed such as an understanding of an amount of information associated with the write command or an understanding of the burst duration 440), or the memory device 330 may avoid decoding the biasing initiated at 407, or the memory device 330 may decode the biasing initiated at 407 but may understand that the biasing is not part of information associated with the write operation (e.g., according to an understanding of the postamble duration 450 and an understanding that the burst 430 has completed). In some examples, the memory device 330 may switch to or maintain a higher receiver impedance (e.g., a higher impedance termination of the receiver 345) at 407, which may support greater power savings or efficiency than when a lower receiver impedance is configured during a postamble duration.

At 408, and after biasing the signal path to the intermediate voltage, $V_{post}$, the system 300 may initiate a transition to an idle state, which may include initiating a biasing of the signal path to an idle voltage (e.g., $V_{idle}$). As a result of biasing the signal path to $V_{post}$, (e.g., as a result of the postamble) as initiated at 407, the voltage swing associated with the operations of 408 (e.g., $V_{idle}-V_{post}$) may be less than the possible voltage swing that would be experienced by the system 300 when the operations of 407 are omitted (e.g., where a voltage swing associated with the operations of 408 may be as large as $V_{idle}-V_{mod,1}$, depending on the final modulation symbol of the burst 430). Accordingly, by including the operations of 407, interference associated with the operations of 408 may be reduced.

At 409, the signal path may have reached the idle voltage, $V_{idle}$, and accordingly the system 300 may be returned to the idle state.

Although the timing diagram 400 illustrates an example where a system 300 returns to an idle state (e.g., at 409), in some examples, a system 300 may not return to an idle state after a burst 430 or after a postamble duration 450. For example, when another access command of a system 300 is determined or communicated, another burst 430 associated with the other access command may be communicated without the system 300 returning to an idle state (e.g., omitting the operations of 408 and 409). In various examples, the other burst 430 may or may not be associated with the same type of access command. For example, a burst 430 associated with a read command may be followed by another burst 430 associated with a read command, or followed by another burst 430 associated with a write command. In another example, a burst 430 associated with a write command may be followed by another burst 430 associated with a write command, or followed by another burst 430 associated with a read command.

In various examples, a burst 430 may be followed by another burst 430 immediately, or a burst 430 may be followed by another burst 430 with an intermediate biasing between bursts 430, which may include a preamble, a postamble, or both. In some examples, a system 300 may be configured to omit a preamble duration 410, a postamble duration 450, or both when another access command has been issued or is otherwise pending (e.g., before initiating an idle voltage biasing at 408, before a postamble biasing is initiated at 407). In other examples, a preamble duration 410, a postamble duration 450, or both may be statically configured to accompany a burst 430, in which case a preamble duration 410, a postamble duration 450, or both may not be omitted.

Although the operations of 401 through 409 are illustrated with particular spacing along the horizontal axis, the timing of the operations of the timing diagram 400 is for illustration purposes, and is not meant to indicate any limitation to particular relative duration between one operation and another. For example, a preamble duration 410 or a postamble duration 450 may have different relative durations when compared with or associated with symbol durations 420 or burst durations 440. In some examples, one or both of a preamble duration 410 or a postamble duration 450 may be equal to a burst duration 440, such that a signal path is biased to an intermediate voltage, or otherwise controlled to be biased to an intermediate voltage, over a duration that is equal to a burst duration 440. In some examples, one or both of a preamble duration 410 or a postamble duration 450 may be less than a burst duration 440, such that a signal path is biased to an intermediate voltage, or otherwise controlled to be biased to an intermediate voltage, over a duration that is less than a burst duration 440. For example, one or both of a preamble duration 410 or a postamble duration 450 may be equal to a symbol duration 420, such that a signal path is biased to an intermediate voltage, or otherwise controlled to be biased to an intermediate voltage, over a duration that is equal to a symbol duration 420.

Further, although the biasing initiated at 402 (e.g., a preamble) is illustrated as a transition to a single voltage level (e.g., a single $V_{pre}$), other examples in accordance with the present disclosure may include more than one intermediate voltage (e.g., more than one $V_{pre}$) before initiating an information transfer. For example, biasing initiated at 402 may include a first biasing to a first preamble voltage level and a second biasing to a second preamble voltage level, where the first preamble voltage may be between an idle voltage and the second preamble voltage (e.g., according to a stepped preamble having two or more steps). In some examples, a corresponding preamble duration 410 may include multiple shorter durations (e.g., multiple durations each equal to a symbol duration 420), and each biasing of a stepped preamble may be performed according to a respective one of the shorter durations. In some examples, including single-step preambles or multiple-step preambles, a configuration may be rate-sensitive, which may include a static configuration or a dynamic configuration that is based at least in part on a rate of operations of the system 300 (e.g., a clock rate, a symbol duration 420).

Likewise, although the biasing initiated at 407 (e.g., a postamble) is illustrated as a transition to a single voltage level (e.g., a single $V_{post}$), other examples in accordance with the present disclosure may include more than one intermediate voltage (e.g., more than one $V_{post}$) after or upon completing an information transfer. For example, biasing initiated at 407 may include a first biasing to a first postamble voltage level and a second biasing to a second postamble voltage level, where the second postamble voltage may be between the first postamble voltage level and an idle voltage level (e.g., according to a stepped postamble having two or more steps). In some examples, a corresponding postamble duration 450 may include multiple shorter durations (e.g., multiple durations each equal to a symbol duration 420), and each biasing of a stepped postamble may be performed according to a respective one of the shorter durations. In some examples, including single-step postambles or multiple-step postambles, a configuration may be rate-sensitive, which may include a static configuration or a dynamic configuration that is based at least in part on a rate of operations of the system 300 (e.g., a clock rate, a symbol duration 420).

Further, although the timing diagram 400 is described with reference to a single signal path, the described techniques may be performed on multiple signal paths in accordance with the present disclosure. For example, when information is conveyed over a channel associated with multiple signal paths (e.g., a multi-path DQ channel), each of the signal paths may be associated with a same or different preamble or postamble biasing (e.g., a same or different timing for initiating preamble or postamble operations, a same or different voltage level or set of voltage levels for preambles or postambles).

In some examples, each of the signal paths of a multi-path channel may have a preamble initiated at a same time (e.g., the operations of 402 associated with one signal path may coincide with the operations of 402 associated with each of the other signal paths). In other examples, each of the signal paths of a multi-path channel may have a preamble initiated at a different time (e.g., the operations of 402 associated with one signal path may not coincide with the operations of 402 associated with any of the other signal paths). In other words, in some examples, the preambles of a multi-path channel may be stepped or sequenced in time before a burst 430 (e.g., according to a sequence of durations equal to a symbol duration 420, such as when a preamble duration 410 equals a burst duration 440 that includes a set of symbol durations 420). However, in some examples, a burst 430 may be initiated at the same time on each of the signal paths of the channel. Additionally or alternatively, a set of signal paths of a multi-path channel may each be associated with a same preamble voltage or set of stepped preamble voltages, or a set of signal paths of a multi-path channel may not each be associated with a same preamble voltage or set of stepped preamble voltages. Such examples of sequencing preambles in time for different signal paths or using different preamble voltages for different signal paths may further reduce interference from the different signal paths when compared to conditions when initiating preambles at the same time or to the same voltage for the different signal paths.

In some examples, each of the signal paths of a multi-path channel may have a postamble initiated at a same time (e.g., the operations of 407 associated with one signal path may coincide with the operations of 407 associated with each of the other signal paths). In other examples, each of the signal paths of a multi-path channel may have a postamble initiated at a different time (e.g., the operations of 407 associated with one signal path may not coincide with the operations of 407 associated with any of the other signal paths). In other words, in some examples, the postambles of a multi-path channel may be stepped or sequenced in time after a burst 430 (e.g., according to a sequence of durations equal to a symbol duration 420, such as when a postamble duration 450 equals a burst duration 440 that includes a set of symbol durations 420), although a burst 430 may be completed at the same time on each of the signal paths of the channel. Additionally or alternatively, a set of signal paths of a multi-path channel may be associated with a same postamble voltage or set of stepped postamble voltages, or a set of signal paths of a multi-path channel may not each be associated with a same postamble voltage or set of stepped postamble voltages. Such examples of sequencing postambles in time for different signal paths or using different postamble voltages for different signal paths may further reduce interference from the different signal paths when compared to conditions when initiating postambles at the same time or to the same voltage for the different signal paths.

Although the timing diagram 400 is described with reference to a host device 310 and a memory device 330, the described techniques may apply to other electronic systems configured to bias a signal path in a manner to reduce interference with other signals during transitions to and from an idle state. For example, components or devices of various electronic systems that support information transfer according to modulation symbols may be configured to bias a signal path, between an idle state and a subsequent information transfer or between an information transfer and a subsequent idle state, to a voltage level that is between voltage levels of a modulation scheme used for communicating information (e.g., a mid-bias voltage). Thus, the described techniques may be generally applied in systems such as graphics cards, vehicle control systems such as advanced driver assistance systems (ADAS), networking equipment, and other electronic systems that support modulated information transfer, and are configured to support transitions between operating modes such as transitions to and from an idle state.

Figure 5:
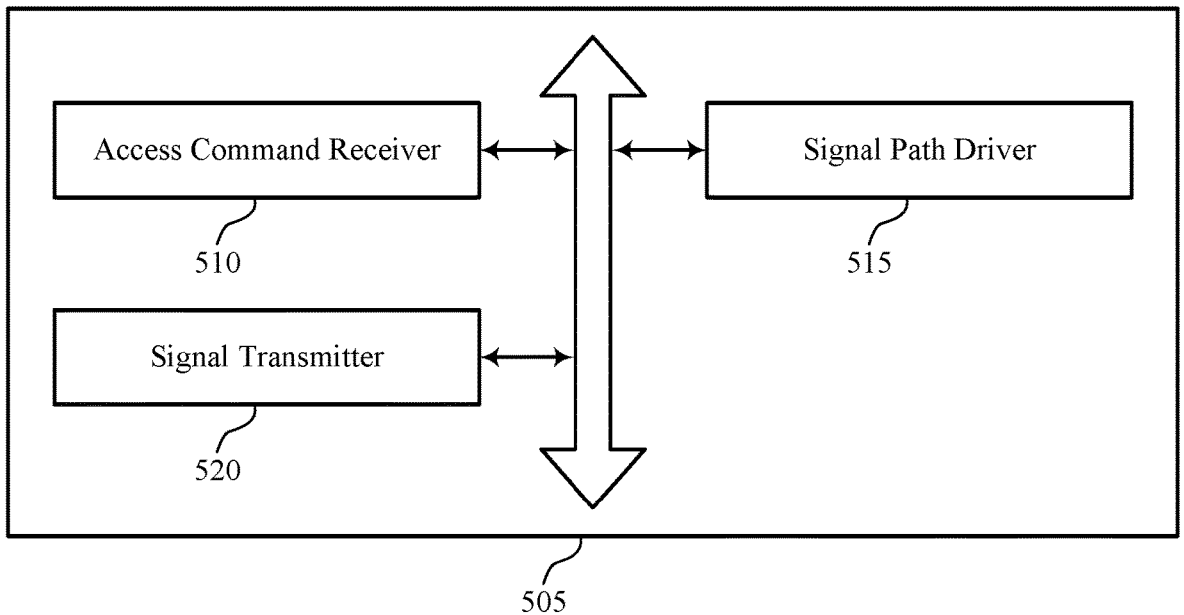
FIG. 5 shows a block diagram of a memory device that supports signal path biasing in a memory system in accordance with examples as disclosed herein.

FIG. 5 shows a block diagram 500 of a memory device 505 that supports signal path biasing in a memory system in accordance with examples as disclosed herein. The memory device 505 may be an example of aspects of a memory device as described with reference to FIGS. 1 through 4. The memory device 505 may include an access command receiver 510, a signal path driver 515, and a signal transmitter 520. Each of these modules may communicate, directly or indirectly, with one another (e.g., via one or more buses).

The access command receiver 510 may be configured to receive an access command that is associated with information to be transmitted to a host device over a signal path using a modulation scheme that includes three or more voltage levels, the modulation scheme including a first voltage level, a second voltage level higher than the first voltage level, and a third voltage level higher than the second voltage level. In some cases, the access command includes a read command that is received over a control channel.

The signal path driver 515 may be configured to bias, based on an access command, the signal path to a fourth voltage level between the first voltage level and the third voltage level. In some examples, the signal path driver 515 may bias, after transmitting the signal, the signal path to a fifth voltage level between the first voltage level and the third voltage level. In some cases, the fourth voltage level and the fifth voltage level are equal. In some examples, the signal path driver 515 may bias, after biasing the signal path to the fifth voltage level, the signal path to a sixth voltage level that is between the fifth voltage level and a termination voltage level.

In some examples, the signal path driver 515 may be configured to bias, before biasing the signal path to the fourth voltage level, the signal path to a seventh voltage level that is between a termination voltage level and the fourth voltage level. In some examples, biasing the signal path to the fourth voltage level includes a preamble (e.g., prepending a preamble, applying a preamble voltage) and biasing the signal path to the fifth voltage level includes a postamble (e.g., appending a postamble, applying a postamble voltage). In some cases, the fourth voltage level is equal to the second voltage level of the modulation scheme. In some cases, the fourth voltage level is different than a voltage level of the modulation scheme used to communicate the information.

In some cases, the fourth voltage level is a mid-point voltage level between the first voltage level and the third voltage level. In some cases, the signal path is biased to the fourth voltage level for a duration that is equal to the burst duration. In some cases, the signal path is biased to the fourth voltage level for a duration that is shorter than the burst duration. In some cases, the duration is equal to one symbol duration.

The signal transmitter 520 may be configured to transmit, over the signal path after biasing the signal path to the fourth voltage level, a signal modulated using the modulation scheme to include the information. In some cases, the signal is transmitted for at least one burst duration that includes a set of symbol durations. In some cases, the modulation scheme is a PAM3 modulation scheme including the first voltage level, the second voltage level, and the third voltage level. In some cases, the modulation scheme is a PAM4 modulation scheme including the first voltage level, the second voltage level, the third voltage level, and an eighth voltage level between the second voltage level and the third voltage level.

Figure 6:
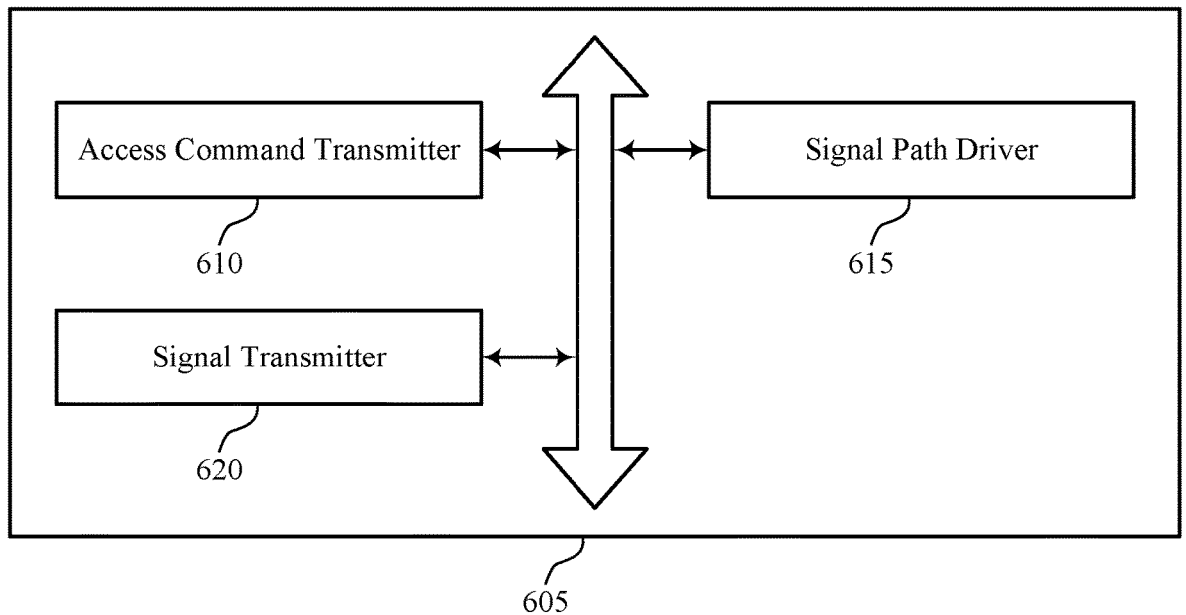
FIG. 6 shows a block diagram of a host device that supports signal path biasing in a memory system in accordance with examples as disclosed herein.

FIG. 6 shows a block diagram 600 of a host device 605 that supports signal path biasing in a memory system in accordance with examples as disclosed herein. The host device 605 may be an example of aspects of a host device as described with reference to FIGS. 1 through 4. The host device 605 may include an access command transmitter 610, a signal path driver 615, and a signal transmitter 620. Each of these modules may communicate, directly or indirectly, with one another (e.g., via one or more buses).

The access command transmitter 610 may be configured to transmit an access command that is associated with information to be transmitted to a memory device over a signal path using a modulation scheme that includes three or more voltage levels, the modulation scheme including a first voltage level, a second voltage level higher than the first voltage level, and a third voltage level higher than the second voltage level. In some cases, the access command includes a write command that is transmitted over a control channel.

The signal path driver 615 may bias, by a host device based on the access command, the signal path to a fourth voltage level between the first voltage level and the third voltage level. In some examples, the signal path driver 615 may bias, after transmitting the signal, the signal path to a fifth voltage level higher than the first voltage level of the modulation scheme and lower than the third voltage level of the modulation scheme. In some examples, the signal path driver 615 may bias, after biasing the signal path to the fifth voltage level, the signal path to a sixth voltage level that is between the fifth voltage level and a termination voltage level.

In some examples, the signal path driver 615 may bias, before biasing the signal path to the fourth voltage level, the signal path to a seventh voltage level that is between a termination voltage level and the fourth voltage level. In some examples, biasing the signal path to the fourth voltage level includes a preamble (e.g., prepending a preamble, applying a preamble voltage) and biasing the signal path to the fifth voltage level includes a postamble (e.g., appending a postamble, applying a postamble voltage). In some cases, the fourth voltage level and the fifth voltage level are equal. In some cases, the fourth voltage level is equal to the second voltage level of the modulation scheme.

In some cases, the fourth voltage level is different than a voltage level of the modulation scheme used to communicate the information. In some cases, the fourth voltage level is a mid-point voltage level between the first voltage level and the third voltage level. In some cases, the signal path is biased to the fourth voltage level for a duration that is equal to one burst duration. In some cases, the signal path is biased to the fourth voltage level for a duration that is shorter than the burst duration. In some cases, the duration is equal to one symbol duration.

The signal transmitter 620 may transmit, over the signal path after biasing the signal path to the fourth voltage level, a signal modulated using the modulation scheme to include the information. In some cases, the signal is transmitted for at least one burst duration that includes a set of symbol durations. In some cases, the modulation scheme is a PAM3 modulation scheme including the first voltage level, the second voltage level, and the third voltage level. In some cases, the modulation scheme is a PAM4 modulation scheme including the first voltage level, the second voltage level, the third voltage level, and an eighth voltage level higher than the second voltage level and lower than the third voltage level.

Figure 7:
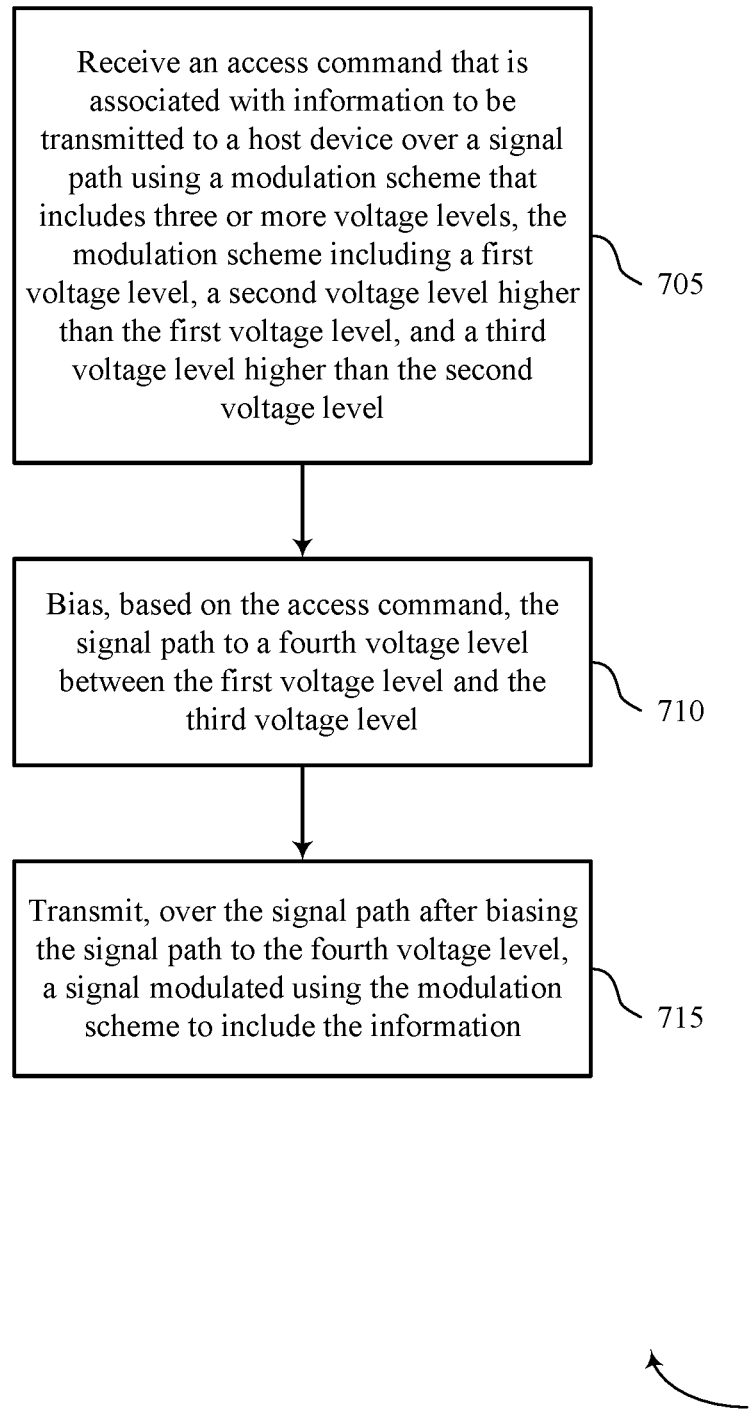
FIGS. 7 and 8 show flowcharts illustrating a method or methods that support signal path biasing in a memory system in accordance with examples as disclosed herein.

FIG. 7 shows a flowchart illustrating a method or methods 700 that supports signal path biasing in a memory system in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may receive an access command that is associated with information to be transmitted to a host device over a signal path using a modulation scheme that includes three or more voltage levels, the modulation scheme including a first voltage level, a second voltage level higher than the first voltage level, and a third voltage level higher than the second voltage level. The operations of 705 may be performed according to the methods described herein. In some examples, aspects of the operations of 705 may be performed by an access command receiver as described with reference to FIG. 5.

At 710, the memory device may bias, based on the access command, the signal path to a fourth voltage level between the first voltage level and the third voltage level. The operations of 710 may be performed according to the methods described herein. In some examples, aspects of the operations of 710 may be performed by a signal path driver as described with reference to FIG. 5.

At 715, the memory device may transmit, over the signal path after biasing the signal path to the fourth voltage level, a signal modulated using the modulation scheme to include the information. The operations of 715 may be performed according to the methods described herein. In some examples, aspects of the operations of 715 may be performed by a signal transmitter as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for: receiving an access command that is associated with information to be transmitted to a host device over a signal path using a modulation scheme that includes three or more voltage levels, the modulation scheme including a first voltage level, a second voltage level higher than the first voltage level, and a third voltage level higher than the second voltage level; biasing, by a memory device based on the access command, the signal path to a fourth voltage level between the first voltage level and the third voltage level; and transmitting, over the signal path after biasing the signal path to the fourth voltage level, a signal modulated using the modulation scheme to include the information.

Some examples of the method 700 and the apparatus described herein may further include operations, features, means, or instructions for biasing, after transmitting the signal, the signal path to a fifth voltage level between the first voltage level and the third voltage level. In some examples of the method 700 and the apparatus described herein, the fourth voltage level and the fifth voltage level may be equal.

Some examples of the method 700 and the apparatus described herein may further include operations, features, means, or instructions for biasing, after biasing the signal path to the fifth voltage level, the signal path to a sixth voltage level that may be between the fifth voltage level and a voltage level of a termination (e.g., for a host device, for a memory device, for a signal path). Some examples of the method 700 and the apparatus described herein may further include operations, features, means, or instructions for biasing the signal path to the fourth voltage level includes a preamble (e.g., prepending a preamble, applying a preamble voltage) and biasing the signal path to the fifth voltage level includes a postamble (e.g., appending a postamble, applying a postamble voltage).

Some examples of the method 700 and the apparatus described herein may further include operations, features, means, or instructions for biasing, before biasing the signal path to the fourth voltage level, the signal path to a seventh voltage level that may be between a voltage level of a termination (e.g., for a host device, for a memory device, for a signal path) and the fourth voltage level. In some examples of the method 700 and the apparatus described herein, the fourth voltage level may be equal to the second voltage level of the modulation scheme. In some examples of the method 700 and the apparatus described herein, the fourth voltage level may be different than a voltage level of the modulation scheme used to communicate the information.

In some examples of the method 700 and the apparatus described herein, the fourth voltage level may be a mid-point voltage level between the first voltage level and the third voltage level. In some examples of the method 700 and the apparatus described herein, the signal may be transmitted for at least one burst duration that includes a set of symbol durations, and the signal path may be biased to the fourth voltage level for a duration that may be equal to the burst duration. In some examples of the method 700 and the apparatus described herein, the signal may be transmitted for at least one burst duration that includes a set of symbol durations, and the signal path may be biased to the fourth voltage level for a duration that may be shorter than the burst duration. In some examples of the method 700 and the apparatus described herein, the duration may be equal to one symbol duration.

In some examples of the method 700 and the apparatus described herein, the access command includes a read command that may be received over a control channel (e.g., a CA channel). In some examples of the method 700 and the apparatus described herein, the modulation scheme may be a PAM3 modulation scheme including the first voltage level, the second voltage level, and the third voltage level. In some examples of the method 700 and the apparatus described herein, the modulation scheme may be a PAM4 modulation scheme including the first voltage level, the second voltage level, the third voltage level, and an eighth voltage level between the second voltage level and the third voltage level.

Figure 8:
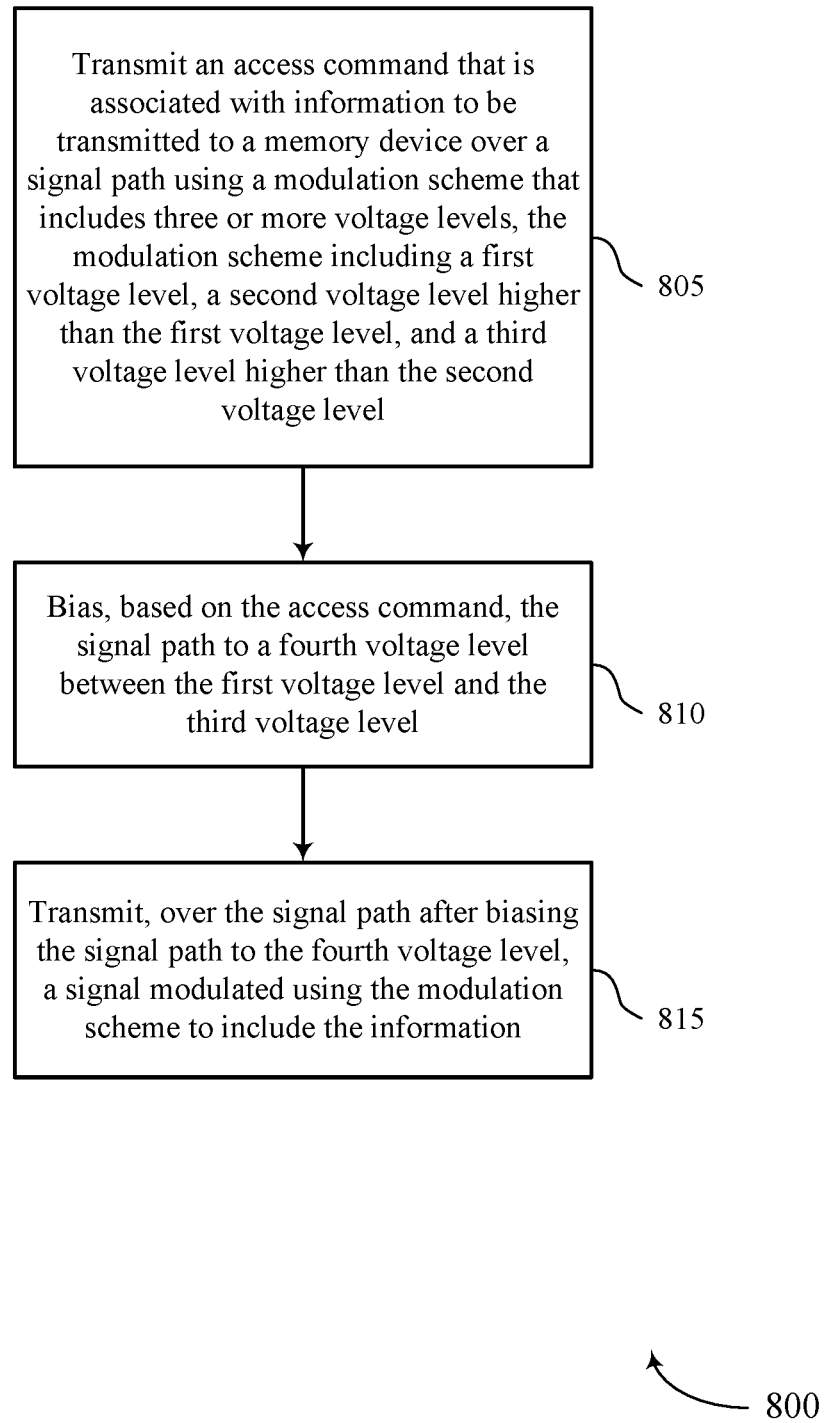

FIG. 8 shows a flowchart illustrating a method or methods 800 that supports signal path biasing in a memory system in accordance with examples as disclosed herein. The operations of method 800 may be implemented by a host device or its components as described herein. For example, the operations of method 800 may be performed by a host device as described with reference to FIG. 6. In some examples, a host device may execute a set of instructions to control the functional elements of the host device to perform the described functions. Additionally or alternatively, a host device may perform aspects of the described functions using special-purpose hardware.

At 805, the host device may transmit an access command that is associated with information to be transmitted to a memory device over a signal path using a modulation scheme that includes three or more voltage levels, the modulation scheme including a first voltage level, a second voltage level higher than the first voltage level, and a third voltage level higher than the second voltage level. The operations of 805 may be performed according to the methods described herein. In some examples, aspects of the operations of 805 may be performed by an access command transmitter as described with reference to FIG. 6.

At 810, the host device may bias, based on the access command, the signal path to a fourth voltage level between the first voltage level and the third voltage level. The operations of 810 may be performed according to the methods described herein. In some examples, aspects of the operations of 810 may be performed by a signal path driver as described with reference to FIG. 6.

At 815, the host device may transmit, over the signal path after biasing the signal path to the fourth voltage level, a signal modulated using the modulation scheme to include the information. The operations of 815 may be performed according to the methods described herein. In some examples, aspects of the operations of 815 may be performed by a signal transmitter as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for: transmitting an access command that is associated with information to be transmitted to a memory device over a signal path using a modulation scheme that includes three or more voltage levels, the modulation scheme including a first voltage level, a second voltage level higher than the first voltage level, and a third voltage level higher than the second voltage level; biasing, by a host device based on the access command, the signal path to a fourth voltage level between the first voltage level and the third voltage level; and transmitting, over the signal path after biasing the signal path to the fourth voltage level, a signal modulated using the modulation scheme to include the information.

Some examples of the method 800 and the apparatus described herein may further include operations, features, means, or instructions for biasing, after transmitting the signal, the signal path to a fifth voltage level higher than the first voltage level of the modulation scheme and lower than the third voltage level of the modulation scheme.

In some examples of the method 800 and the apparatus described herein, the fourth voltage level and the fifth voltage level may be equal. Some examples of the method 800 and the apparatus described herein may further include operations, features, means, or instructions for biasing, after biasing the signal path to the fifth voltage level, the signal path to a sixth voltage level that may be between the fifth voltage level and a voltage level of a termination (e.g., for a host device, for a memory device, for a signal path).

Some examples of the method 800 and the apparatus described herein may further include operations, features, means, or instructions for biasing the signal path to the fourth voltage level includes a preamble (e.g., prepending a preamble, applying a preamble voltage) and biasing the signal path to the fifth voltage level includes a postamble (e.g., appending a postamble, applying a postamble voltage). Some examples of the method 800 and the apparatus described herein may further include operations, features, means, or instructions for biasing, before biasing the signal path to the fourth voltage level, the signal path to a seventh voltage level that may be between a voltage level of a termination (e.g., for a host device, for a memory device, for a signal path) and the fourth voltage level.

In some examples of the method 800 and the apparatus described herein, the fourth voltage level may be equal to the second voltage level of the modulation scheme. In some examples of the method 800 and the apparatus described herein, the fourth voltage level may be different than a voltage level of the modulation scheme used to communicate the information. In some examples of the method 800 and the apparatus described herein, the fourth voltage level may be a mid-point voltage level between the first voltage level and the third voltage level.

In some examples of the method 800 and the apparatus described herein, the signal may be transmitted for at least one burst duration that includes a set of symbol durations, and the signal path may be biased to the fourth voltage level for a duration that may be equal to one burst duration. In some examples of the method 800 and the apparatus described herein, the signal may be transmitted for at least one burst duration that includes a set of symbol durations, and the signal path may be biased to the fourth voltage level for a duration that may be shorter than the burst duration. In some examples of the method 800 and the apparatus described herein, the duration may be equal to one symbol duration. In some examples of the method 800 and the apparatus described herein, the access command includes a write command that may be transmitted over a control channel.

In some examples of the method 800 and the apparatus described herein, the modulation scheme may be a PAM3 modulation scheme including the first voltage level, the second voltage level, and the third voltage level. In some examples of the method 800 and the apparatus described herein, the modulation scheme may be a PAM4 modulation scheme including the first voltage level, the second voltage level, the third voltage level, and an eighth voltage level higher than the second voltage level and lower than the third voltage level.

A memory device is described. In some examples, the memory device may include a receiver configured to receive an access command that is associated with information to be transmitted to a host device over a signal path using a modulation scheme that includes three or more voltage levels, the modulation scheme comprising a first voltage level, a second voltage level higher than the first voltage level, and a third voltage level higher than the second voltage level. The apparatus may also include a driver configured to bias, based at least in part on the access command, the signal path to a fourth voltage level between the first voltage level and the third voltage level and transmit, over the signal path after biasing the signal path to the fourth voltage level, a signal modulated using the modulation scheme to include the information.

In some examples, the driver may be configured to bias, after transmitting the signal, the signal path to a fifth voltage level between the first voltage level and the third voltage level. In some examples, biasing the signal path to the fourth voltage level comprises prepending a preamble and biasing the signal path to the fifth voltage level comprises appending a postamble. In some examples the driver may be configured to bias, before biasing the signal path to the fourth voltage level, the signal path to a seventh voltage level that is between a voltage level of termination for the signal path and the fourth voltage level.

A host device is described. In some examples, the host device may include a transmitter configured to transmit an access command that is associated with information to be transmitted to a memory device over a signal path using a modulation scheme that includes three or more voltage levels, the modulation scheme comprising a first voltage level, a second voltage level higher than the first voltage level, and a third voltage level higher than the second voltage level. The host device may include a driver configured to bias, based at least in part on the access command, the signal path to a fourth voltage level between the first voltage level and the third voltage level and transmit, over the signal path after biasing the signal path to the fourth voltage level, a signal modulated using the modulation scheme to include the information.

In some examples, the driver may be configured to bias, after transmitting the signal, the signal path to a fifth voltage level between the first voltage level and the third voltage level.

A system is described. In some examples, the system may include a memory device and a host device coupled with the memory device. The system may be configured to communicate a read command associated with information to be communicated, from the memory device to the host device, over a signal path using a modulation scheme that includes three or more voltage levels, the modulation scheme comprising a first voltage level, a second voltage level higher than the first voltage level, and a third voltage level higher than the second voltage level, bias the signal path to a fourth voltage level between the first voltage level and the third voltage level, and communicate, over the signal path after biasing the signal path to the fourth voltage level, a signal modulated using the modulation scheme to include the information.

A system is described. In some examples, the system may include a memory device and a host device coupled with the memory device. The system may be configured to communicate a write command associated with information to be communicated, from the host device to the memory device, over a signal path using a modulation scheme that includes three or more voltage levels, the modulation scheme comprising a first voltage level, a second voltage level higher than the first voltage level, and a third voltage level higher than the second voltage level, bias the signal path to a fourth voltage level between the first voltage level and the third voltage level, and communicate, over the signal path after biasing the signal path to the fourth voltage level, a signal modulated using the modulation scheme to include the information.

It should be noted that the methods described above describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    transmitting an access command that is associated with information to be transmitted to a memory device over a signal path using a modulation scheme that includes three or more voltage levels, the three or more voltage levels comprising a first voltage level, a second voltage level higher than the first voltage level, and a third voltage level higher than the second voltage level;
    biasing, based at least in part on the access command, the signal path to a fourth voltage level between the first voltage level and the third voltage level; and
    transmitting, over the signal path after biasing the signal path to the fourth voltage level, a signal modulated using the modulation scheme to include the information.

2. The method of claim 1, further comprising:
    biasing, after transmitting the signal, the signal path to a fifth voltage level higher than the first voltage level of the modulation scheme and lower than the third voltage level of the modulation scheme.

3. The method of claim 2, wherein the fourth voltage level and the fifth voltage level are equal.

4. The method of claim 2, further comprising:
    biasing, after biasing the signal path to the fifth voltage level, the signal path to a sixth voltage level that is between the fifth voltage level and a voltage level of termination for the signal path.

5. The method of claim 2, wherein biasing the signal path to the fourth voltage level comprises prepending a preamble and biasing the signal path to the fifth voltage level comprises appending a postamble.

6. The method of claim 1, further comprising:
    biasing, before biasing the signal path to the fourth voltage level, the signal path to a seventh voltage level that is between a voltage level of termination for the signal path and the fourth voltage level.

7. The method of claim 1, wherein the fourth voltage level is equal to the second voltage level of the modulation scheme.

8. The method of claim 1, wherein the fourth voltage level is different than a voltage level of the modulation scheme used to communicate the information.

9. The method of claim 1, wherein the fourth voltage level is a mid-point voltage level between the first voltage level and the third voltage level.

10. The method of claim 1, wherein:
the signal is transmitted for at least one burst duration that comprises a plurality of symbol durations; and
the signal path is biased to the fourth voltage level for a duration that is equal to one burst duration.

11. The method of claim 1, wherein:
the signal is transmitted for at least one burst duration that comprises a plurality of symbol durations; and
the signal path is biased to the fourth voltage level for a duration that is shorter than the at least one burst duration.

12. The method of claim 1, wherein the modulation scheme is a PAM4 modulation scheme comprising the first voltage level, the second voltage level, the third voltage level, and an eighth voltage level higher than the second voltage level and lower than the third voltage level.

13. A device, comprising:
a transmitter configured to transmit an access command that is associated with information to be transmitted to a memory device over a signal path using a modulation scheme that includes three or more voltage levels, the three or more voltage levels comprising a first voltage level, a second voltage level higher than the first voltage level, and a third voltage level higher than the second voltage level; and
a driver configured to:
bias, based at least in part on the access command, the signal path to a fourth voltage level between the first voltage level and the third voltage level; and
transmit, over the signal path after biasing the signal path to the fourth voltage level, a signal modulated using the modulation scheme to include the information.

14. The device of claim 13, wherein the driver is further configured to:
bias, after transmitting the signal, the signal path to a fifth voltage level between the first voltage level and the third voltage level.

15. The device of claim 14, wherein the driver is further configured to:
bias, after biasing the signal path to the fifth voltage level, the signal path to a sixth voltage level that is between the fifth voltage level and a voltage level of termination for the signal path.

16. The device of claim 14, wherein biasing the signal path to the fourth voltage level comprises prepending a preamble and biasing the signal path to the fifth voltage level comprises appending a postamble.

17. The device of claim 13, wherein the driver is further configured to:
bias, before biasing the signal path to the fourth voltage level, the signal path to a seventh voltage level that is between a voltage level of termination for the signal path and the fourth voltage level.

18. A system, comprising:
a memory device; and
a host device coupled with the memory device,
the system configured to:
communicate a write command associated with information to be communicated, from the host device to the memory device, over a signal path using a modulation scheme that includes three or more voltage levels, the three or more voltage levels comprising a first voltage level, a second voltage level higher than the first voltage level, and a third voltage level higher than the second voltage level;
bias the signal path to a fourth voltage level between the first voltage level and the third voltage level; and
communicate, over the signal path after biasing the signal path to the fourth voltage level, a signal modulated using the modulation scheme to include the information.

19. The system of claim 18, wherein the system is further configured to:
bias, after communicating the signal, the signal path to a fifth voltage level higher than the first voltage level and lower than the third voltage level.

20. The system of claim 18, wherein the system is further configured to:
biasing, before biasing the signal path to the fourth voltage level, the signal path to a sixth voltage level that is between a voltage level of termination for the signal path and the fourth voltage level.

* * * * *